(12) United States Patent
Jin et al.

(10) Patent No.: US 11,777,269 B2
(45) Date of Patent: Oct. 3, 2023

(54) CONNECTION BODY OF HIGH-TEMPERATURE SUPERCONDUCTING WIRE MATERIALS AND CONNECTING METHOD

(71) Applicant: RIKEN, Wako (JP)

(72) Inventors: Xinzhe Jin, Muroran (JP); Yoshinori Yanagisawa, Wako (JP); Renzhong Piao, Wako (JP); Yu Suetomi, Wako (JP)

(73) Assignee: RIKEN, Wako (JP)

(*) Notice: Subject to any disclaimer, the term of this patent is extended or adjusted under 35 U.S.C. 154(b) by 1063 days.

Patent file contains an affidavit/declaration under 37 CFR 1.130(b).

(21) Appl. No.: 16/419,778

(22) Filed: May 22, 2019

(65) Prior Publication Data
US 2020/0106229 A1   Apr. 2, 2020

(30) Foreign Application Priority Data
Sep. 28, 2018   (JP) ................ 2018-184184

(51) Int. Cl.
*H01R 43/02* (2006.01)
*H01R 4/68* (2006.01)
(Continued)

(52) U.S. Cl.
CPC ............ *H01R 43/02* (2013.01); *H01R 4/68* (2013.01); *H10N 60/0661* (2023.02); *H10N 60/0801* (2023.02); *H10N 60/857* (2023.02)

(58) Field of Classification Search
CPC ...... H01R 43/02; H01R 4/68; H10N 60/0661; H10N 60/0801; H10N 60/857
See application file for complete search history.

(56) References Cited

U.S. PATENT DOCUMENTS 5,340,794 A * 8/1994 Tallon ................ H01L 39/2483
252/519.1
5,455,223 A * 10/1995 Rupich ............... H01L 39/2477
505/238
(Continued)

FOREIGN PATENT DOCUMENTS

JP      8-104522 A      4/1996
JP      2011-515792 A   5/2011
WO      WO 2015/118732 A1   8/2015

OTHER PUBLICATIONS

Di Castro et al., "High-T_{c} Superconductivity at the Interface between the CaCuO_{2} and SrTiO_{3} Insulating Oxides" Phys. Rev. Lett. 115 (2015): 147001, total 14 pages.
(Continued)

*Primary Examiner* — Paul A Wartalowicz
(74) *Attorney, Agent, or Firm* — Birch, Stewart, Kolasch & Birch, LLP (57) ABSTRACT

Provided is a connection body of high-temperature superconducting wire materials including a first oxide high-temperature superconducting wire material and a second oxide high-temperature superconducting wire material, characterized in that a first superconducting layer of the first oxide high-temperature superconducting wire material and a second superconducting layer of the second oxide high-temperature superconducting wire material are bonded (Continued)

together via a junction including M-Cu—O (wherein M is a single metal element or a plurality of metal elements included in the first superconducting layer or the second superconducting layer). The connection body may be, for example, a connection body of Bi2223 wire materials, and the junction may include $CaCuO_2$.

5 Claims, 11 Drawing Sheets

(51) Int. Cl.
*H10N 60/01* (2023.01)
*H10N 60/85* (2023.01)

(56) References Cited

U.S. PATENT DOCUMENTS

| | | | |
|---|---|---|---|
| 9,941,032 | B2 | 4/2018 | Jin et al. |
| 2009/0298696 | A1* | 12/2009 | Otto ................ H10N 60/80 174/125.1 |
| 2010/0009855 | A1* | 1/2010 | Ekbote ............ H01L 39/2419 419/62 |
| 2010/0210468 | A1 | 8/2010 | Lee et al. |
| 2013/0061458 | A1 | 3/2013 | Lee et al. |
| 2016/0247607 | A1 | 8/2016 | Oh et al. |

OTHER PUBLICATIONS

Guo et al., "Fabrication of joint Bi-2223/Ag superconducting tapes with BSCCO superconducting powders by diffusion bonding", Physica C: Superconductivity 470.9-10 (2010), pp. 440-443.

Guo et al., "Superconducting joint of Bi-2223/Ag superconducting tapes by diffusion bonding", Physica C: Superconductivity 469.21 (2009): pp. 1898-1901.

Jin et al., "Superconducting joint between multi-filamentary Bi2223 tapes with incongruent melting", Abstracts of CSSJ Conference, vol. 96 (2018), pp. 85.

Jin et al., "Superconducting joint between multi-filamentary $Bi_2Sr_2Ca_2Cu_3O_{10+\delta}$ tapes based on incongruent melting for NMR and MRI applications", Superconductor Science and Technology, vol. 32 (2019), 035011, total 9 pages.

Japanese Office Action for Japanese Application No. 2018-184184, dated Jan. 17, 2023.

Japanese Office Action for Japanese Application No. 2018-184184, dated Aug. 23, 2022, with a English translation.

* cited by examiner

(a) SURFACE BEFORE BONDING
(b) JUNCTION SURFACE
(c) JUNCTION INTERFACE

| Spectrum | O | Ca | Cu | Sr | Ag | Bi | Bi | Sr | Ca | Cu | O | Ag (%) | SUBSTANCE |
|---|---|---|---|---|---|---|---|---|---|---|---|---|---|
| point 1 | 47.60665 | 14.82488 | 16.918 | 10.89546 | 0.000619 | 9.754398 | 2 | 2 | 2 | 3 | 7 | 0 | Bi2223 |
| point 2 | 6.191014 | 0.319218 | 1.946605 | 0.466901 | 90.84806 | 0.427599 |   |   |   |   |   | 91 | Ag |
| point 3 | 54.3381 | 25.00259 | 13.83951 | 4.619108 | 1.906097 | 0.294589 | 0 | 0 | 1 | 1 | 2 | 2 | CaCuO2 |
| point 4 | 9.544926 | 0.979166 | 1.078814 | 0.512544 | 87.63058 | 0.255994 |   |   |   |   |   | 88 | Ag |
| point 5 | 48.10301 | 1.278671 | 5.14216 | 7.740828 | 30.63883 | 7.096506 |   |   |   |   |   | 31 | Ag |
| point 6 | 49.58263 | 8.213519 | 18.00946 | 12.98855 | 0.000641 | 11.30825 | 2 | 2 | 2 | 3 | 8 | 0 | Bi2223 |
| point 7 | 22.49315 | 20.50237 | 37.84939 | 18.78065 | 0.000546 | 0.373894 | 0 | 1 | 2 | 4 | 1 | 0 | SrCa2Cu2Ox |
| point 8 | 49.29688 | 32.29705 | 6.607377 | 6.432515 | 0.074505 | 5.201077 | 0 | 1 | 3 | 1 | 5 | 0 | SrCa5CuOx |
| point 9 | 47.47011 | 14.18631 | 17.40577 | 11.28029 | 0.000611 | 9.656921 | 2 | 2 | 2 | 3 | 8 | 0 | Bi2223 |
| point 10 | 48.71692 | 12.22115 | 16.20631 | 10.58127 | 1.780693 | 10.49167 | 2 | 2 | 2 | 3 | 8 | 2 | Bi2223 |
| point 11 | 48.81418 | 13.83559 | 17.40908 | 11.1518 | 0.000608 | 8.78875 | 2 | 2 | 2 | 3 | 8 | 0 | Bi2223 |
| point 12 | 45.60689 | 1.239685 | 6.399685 | 10.24491 | 24.97393 | 11.5349 |   |   |   |   |   | 25 | Ag |
| point 13 | 48.0198 | 13.85924 | 16.65226 | 10.76967 | 0.000611 | 10.69808 | 2 | 2 | 2 | 3 | 8 | 0 | Bi2223 |
| point 14 | 48.51423 | 9.204901 | 13.43656 | 9.210646 | 11.5133 | 8.121367 | 2 | 2 | 2 | 3 | 12 | 12 | Bi2223 |
| point 15 | 47.85671 | 14.33911 | 16.1566 | 11.30537 | 0.000608 | 10.34161 | 2 | 2 | 2 | 3 | 8 | 0 | Bi2223 |
| point 16 | 50.28466 | 6.267365 | 16.58981 | 13.89962 | 0.000706 | 12.98782 | 2 | 2 | 1 | 2 | 7 | 0 | Bi2212 |
| point 17 | 50.37332 | 10.74781 | 15.53962 | 10.25304 | 4.235701 | 8.950515 | 2 | 2 | 2 | 3 | 8 | 4 | Bi2223 |
| point 18 | 41.38854 | 14.57846 | 19.76321 | 13.13979 | 0.000657 | 11.12935 | 2 | 2 | 2 | 3 | 6 | 0 | Bi2223 |
| point 19 | 49.13317 | 13.68107 | 16.34149 | 11.51915 | 0.000599 | 9.324521 | 2 | 2 | 2 | 3 | 9 | 0 | Bi2223 |
| point 20 | 50.946 | 13.06883 | 16.61786 | 10.59961 | 0.000586 | 8.767116 | 2 | 2 | 2 | 3 | 9 | 0 | Bi2223 |
| point 21 | 49.43462 | 12.86259 | 17.19215 | 11.42656 | 0.000608 | 9.08124 | 2 | 2 | 2 | 3 | 9 | 0 | Bi2223 |
| point 22 | 49.08126 | 12.10034 | 17.21365 | 11.75659 | 0.636927 | 9.211239 | 2 | 2 | 2 | 3 | 9 | 1 | Bi2223 |
| point 23 | 48.20838 | 8.022504 | 15.30210 | 13.08433 | 2.821018 | 12.56161 | 2 | 2 | 1 | 2 | 6 | 3 | Bi2212 |
| point 24 | 47.51491 | 15.25386 | 16.18411 | 11.72825 | 0.000612 | 9.318269 | 2 | 2 | 2 | 3 | 8 | 0 | Bi2223 |
| point 25 | 47.4921 | 14.49625 | 16.23787 | 11.75759 | 0.635098 | 9.381097 | 2 | 2 | 2 | 3 | 8 | 1 | Bi2223 |

| Spectrum | O | Ca | Cu | Sr | Ag | Bi | Bi | Sr | Ca | Cu | O | Ag(%) | SUBSTANCE |
|---|---|---|---|---|---|---|---|---|---|---|---|---|---|
| p 1 | 34.92116 | 7.593871 | 2.852102 | 3.288986 | 50.87805 | 0.465831 | | | | | | 51 | Ag |
| p 2 | 46.88682 | 23.29745 | 9.587649 | 5.03517 | 14.48432 | 0.708595 | 0 | 0 | 1 | 1 | 3 | 14 | CaCuO2 |
| p 3 | 51.80278 | 25.69362 | 14.39233 | 5.794809 | 2.006696 | 0.309764 | 0 | 0 | 1 | 1 | 2 | 2 | CaCuO2 |
| p 4 | 59.81592 | 12.13312 | 19.10431 | 8.503105 | 0.387798 | 0.055743 | | | 1 | 1 | 2 | 0 | CaCuO2 |
| p 5 | 47.79874 | 11.88945 | 16.90668 | 9.115235 | 13.94556 | 0.34434 | 0 | 1 | 1 | 1 | 4 | 14 | SrCaCuOx |
| p 6 | 43.98337 | 2.781584 | 0.665535 | 1.419102 | 50.93234 | 0.218074 | | | | | | 51 | Ag |
| p 7 | 62.71622 | 11.91863 | 1.109417 | 1.604707 | 22.50829 | 0.142731 | | | | | | 23 | Ag |
| p 8 | 50.74233 | 8.243815 | 12.0599 | 7.609892 | 21.07814 | 0.265915 | | | | | | 21 | Ag |
| p 9 | 56.47045 | 13.57152 | 6.171485 | 2.951693 | 20.75005 | 0.084799 | | | | | | 21 | Ag |
| p 10 | 39.69299 | 1.45478 | 1.027 | 2.165946 | 55.11002 | 0.549259 | | | | | | 55 | Ag |
| p 11 | 33.61205 | 0.228057 | 0.00123 | 1.970819 | 64.05784 | 0.13 | | | | | | 64 | Ag |
| p 12 | 49.9369 | 4.665648 | 2.076959 | 3.69856 | 37.87079 | 1.751146 | | | | | | 38 | Ag |
| p 13 | 36.98009 | 0.885832 | 0.333557 | 2.012265 | 59.54538 | 0.242871 | | | | | | 60 | Ag |
| p 14 | 32.93798 | 0.076154 | 0.329038 | 2.387526 | 63.86359 | 0.305706 | | | | | | 64 | Ag |
| p 15 | 51.16832 | 15.56517 | 5.593608 | 3.282757 | 24.30327 | 0.086869 | | | | | | 24 | Ag |
| p 16 | 32.10429 | 1.396999 | 0.026141 | 2.357697 | 64.09196 | 0.022917 | | | | | | 64 | Ag |
| p 17 | 53.03649 | 12.26007 | 5.374273 | 3.652558 | 25.56635 | 0.110262 | | | | | | 26 | Ag |
| p 18 | 52.39013 | 20.34578 | 9.493042 | 7.308566 | 9.517435 | 0.945049 | 0 | 1 | 2 | 1 | 5 | 10 | SrCa2CuOx |
| p 19 | 37.86891 | 3.879628 | 1.703994 | 3.062921 | 52.9644 | 0.520151 | | | | | | 53 | Ag |
| p 20 | 52.32669 | 24.20472 | 11.99142 | 6.887438 | 4.385013 | 0.20472 | 0 | 1 | 3 | 1 | 6 | 4 | SrCa3CuOx |
| p 21 | 48.67076 | 8.483877 | 3.633906 | 4.109308 | 35.10186 | 0.000288 | | | | | | 35 | Ag |
| p 22 | 37.76235 | 0.278621 | 0.514722 | 2.292841 | 58.97702 | 0.174441 | | | | | | 59 | Ag |
| p 23 | 52.52809 | 2.312235 | 0.96563 | 2.803548 | 41.3902 | 0.000292 | | | | | | 41 | Ag |
| p 24 | 39.30727 | 1.207303 | 0.010229 | 2.447566 | 56.99005 | 0.037586 | | | | | | 57 | Ag |
| p 25 | 36.28904 | 1.095878 | 0.868666 | 2.60635 | 59.13971 | 0.000363 | | | | | | 59 | Ag |
| p 26 | 41.3264 | 3.317107 | 1.389922 | 2.637046 | 51.26087 | 0.068655 | | | | | | 51 | Ag |
| p 27 | 49.97158 | 8.872067 | 4.185227 | 5.215665 | 31.61357 | 0.14189 | | | | | | 32 | Ag |

FIG. 12A

INTERFACE AFTER BONDING

FIG. 12B

INTERFACE BEFORE BONDING

CONNECTION BODY OF HIGH-TEMPERATURE SUPERCONDUCTING WIRE MATERIALS AND CONNECTING METHOD

BACKGROUND OF THE INVENTION

Field of the Invention

The present invention relates to a connection body of oxide high-temperature superconducting wire materials and a connecting method.

Description of the Related Art

Superconducting wire materials have been widely used in a nuclear magnetic resonance (NMR) device, a magnetic resonance imaging (MRI) device, and the like. Connecting superconducting wire materials is a critical issue for development of a longer wire material, implementation of persistent current mode, and the like.

Out of oxide high-temperature superconducting wire materials, a superconducting bonding technology for a Bi2212 ($Bi_2Sr_2Ca_1Cu_2O_x$) wire material has been put into practical use, and a superconducting bonding technology for a REBCO (($RE)Ba_2Cu_3O_x$) wire material has been already proposed by the present inventors (WO 2015/118732 A1). On the contrary, practical superconducting bonding methods for a Bi2223 ($Bi_2Sr_2Ca_2Cu_3O_x$) wire material have not been available yet.

In Guo, Wei, et al. 2009 and Guo, Wei, et al. 2010, a solid-state diffusion bonding (800° C. and 3 MPa) using a bulk of Bi2223 as a bonding medium has been proposed. However, with the method proposed in these publications, obtainable critical current is much less than required for practical use. Further, the method may involve a solid-state growth process, and thus, it may take a long time for bonding, and bonding strength may be low in these procedures.

CITATION LIST

Patent Literature 1: WO 2015/118732 A1

Non-Patent Literature 1: Guo, Wei, et al. "Superconducting joint of Bi-2223/Ag superconducting tapes by diffusion bonding." Physica C: Superconductivity 469.21 (2009): 1898-1901

Non-Patent Literature 2: Guo, Wei, et al. "Fabrication of joint Bi-2223/Ag superconducting tapes with BSCCO superconducting powders by diffusion bonding." Physica C: Superconductivity 470.9-10 (2010): 440-443

Non-Patent Literature 3: D. Di Castro, et al. "High Tc superconductivity at the interface between the CaCuO2 and SrTiO3 insulating oxides" Phys. Rev. Lett. 115 (2015): 147001

SUMMARY OF THE INVENTION

In view of such problems, it is an object of the present invention to provide a novel superconducting connecting technology, particularly, but not limited to, a practical connecting technology which is applicable to a Bi2223 wire material.

A first aspect of the present invention is a connecting method of high-temperature superconducting wire materials. A method according to the present aspect may include:

an exposing step of exposing a first superconducting layer of a first oxide high-temperature superconducting wire material and a second superconducting layer of a second oxide high-temperature superconducting wire material;

a bonding step of bonding the first superconducting layer and the second superconducting layer by liquid phase diffusion bonding (melt diffusion bonding); and an annealing step of performing oxygen annealing so as to introduce oxygen into the first superconducting layer and the second superconducting layer.

In the bonding step in the present aspect, bonding may be achieved even without using a bonding medium (insert metal). Specifically, superconducting layers may be brought into contact with each other, and heated to a temperature equal to or higher than the melting point of the superconducting layers. As a result, at least a part of the crystal phase is decomposed into a liquid, thereby performing liquid phase bonding while increasing the bonding area. The present method enables high performance superconducting connection with a large critical current. Further, the present method enables growth and connection for a short time by liquid phase growth, as distinct from solid state growth, which requires a long heating time. The present method can implement superconducting connection of oxide high-temperature superconducting wire materials and is also applicable to Bi2223 wire material connection that has not been put into practical use heretofore.

Herein, the first oxide high-temperature superconducting wire material and the second oxide high-temperature superconducting wire material may be each independently any one of Bi2223 ($Bi_2Sr_2Ca_2Cu_3O_x$), Bi2212 ($Bi_2Sr_2Ca_1Cu_2O_x$), and REBCO (($RE)Ba_2Cu_3O_x$, where RE is one or a plurality of rare earth elements). The materials for the first oxide high-temperature superconducting wire material and for the second oxide high-temperature superconducting wire material may be the same or may be different.

In the present aspect, both of the first superconducting layer and the second superconducting layer may be Bi2223. In this case, in the bonding step without a medium, heating is performed to a temperature equal to or higher than the melting point of Bi2223 (about 865° C. in the atmosphere, depending on the oxygen partial pressure). The heating temperature may desirably be equal to or lower than the melting point of Bi2212 (about 885° C. in the atmosphere, depending on the oxygen partial pressure) which is a product generated by incongruent melting of Bi2223. Alternatively, it may be also preferable to melt only the surface of Bi2223 by rapid heating at a still higher temperature. When a bonding medium is used, bonding can be carried out even at the melting point of Bi2223 or lower other than the above description.

Alternatively, when the first and second superconducting layers each include a plurality of Bi2223 filaments and an Ag sheath, the connecting method of the present aspect may desirably further include a pretreatment step of heating the first superconducting layer and the second superconducting layer to a temperature in the vicinity of the melting point of the Ag sheath or to a temperature equal to or higher than the melting point of the Ag sheath (in the case of a bulk, about 960° C., or in the case of fine particles, the temperature largely drops to about 880° C.), thereby removing the Ag sheath.

As a result of this pretreatment step, the filaments in respective wire materials can be brought into contact with one another or approach one another. Then, the first and second superconducting layers may be bonded subsequently, or may be bonded simultaneously in the subsequent wire material bonding steps. Such bonding provides a large critical current.

The connecting method in accordance with the present aspect may further include a reinforcing step of covering a junction part with a reinforcing member that is resistant to oxidation at elevated temperatures, such as an Ag-, Ni-, or Pt-group metal or an alloy including these metal, before heating. As the materials for the reinforcing part, Ag or an Ag alloy can be adopted when an oxygen permeable material is necessary in the oxygen annealing step. The reinforcing step may be performed after the pretreatment step and before the bonding step, or may be performed after the bonding step and before the annealing step. When the reinforcing step is performed before the bonding step, the material which does not melt in the bonding step is desirably used.

A second aspect of the present invention may be a connection body of high-temperature superconducting wire materials. The connection body of the high-temperature superconducting wire materials in accordance with the present aspect may be characterized in that a first superconducting layer of a first oxide high-temperature superconducting wire material and a second superconducting layer of a second oxide high-temperature superconducting wire material are bonded via a junction including M-Cu—O. Herein, M-Cu—O is a compound including elements such as M, Cu, and O, and desirably has a $CuO_2$ layer in the crystal structure. M is desirably a single metal element or a plurality of metal elements included in the first superconducting layer or the second superconducting layer. However, M may be a metal element other than the metal elements included in the first superconducting layer or the second superconducting layer so long as it does not cause a change in performances such as the critical temperature and the critical current of each superconducting layer. A substance with a lower ionization tendency than that of Cu, such as Pd or Au, does not undergo a substitution reaction with Cu of the superconducting layer at elevated temperatures. Alternatively, a substance belonging to the same element group as that of the metal included in the superconducting layer such as Mg or Ba, and an element improving or not largely reducing the performances of the superconducting layer such as Pb can also be used. In the present aspect, M-Cu—O at the junction may desirably be aligned uniformly.

Herein, the first oxide high-temperature superconducting wire material and the second oxide high-temperature superconducting wire material may be each independently any one of Bi2223 ($Bi_2Sr_2Ca_2Cu_3O_x$), Bi2212 ($Bi_2Sr_2Ca_1Cu_2O_x$), and REBCO (($RE)Ba_2Cu_3O_x$, where RE is one or a plurality of rare earth elements). The materials for the first oxide high-temperature superconducting wire material and the second oxide high-temperature superconducting wire material may be the same or may be different. When Bi2223 or Bi2212 is used in the superconducting layer, M may be one to three kinds among Bi, Ca, and Sr (including Bi2234, Bi2223, Bi2212, Bi2201, and the like). When REBCO is used for the superconducting layer, M is RE or Ba, or both thereof.

In the present aspect, both of the first superconducting layer and the second superconducting layer may be each Bi2223. In this case, the M-Cu—O may include at least any of $CaCuO_2$, $CaCu_2O_3$, $Ca_2CuO_3$, Bi2234, Bi2223, Bi2212, Bi2201, and the like, and more desirably includes those other than $CaCu_2O_3$ and $Ca_2CuO_3$ from the viewpoint of having a $CuO_2$ layer in the crystal structure.

In the connection body in accordance with the present aspect, the junction part may be covered with a reinforcing member such as an Ag-, Ni-, or Pt-group metal, or an alloy including the metal. The reinforcing member may be a thin member, such as a metal foil. The reinforcing member can impart a higher mechanical strength to the connection body.

In accordance with the present invention, oxide high-temperature superconducting wire materials can be connected with high performances, and further, Bi2223 wire materials can be connected.

DESCRIPTION OF THE EMBODIMENTS

Referring to the accompanying drawings, an embodiment for executing this invention will be described below.

First Embodiment

In the present embodiment, the filaments in the wire materials are directly bonded therebetween by melting the Bi2223 phase of each Bi2223 multi-core (multifilament) tape wire material.

<Superconducting Wire Material>

Figure 1:
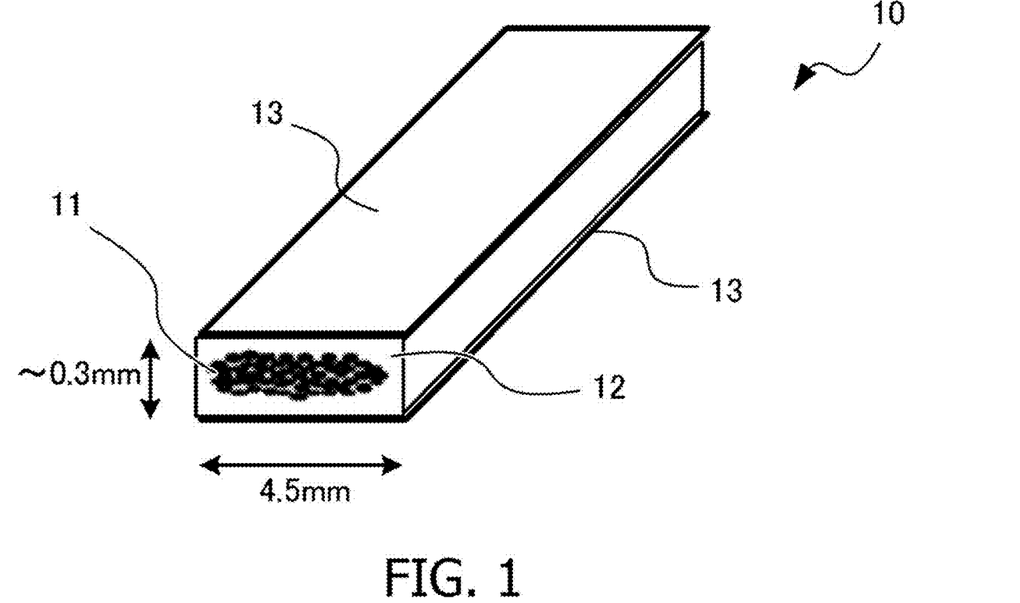
FIG. 1 is a view showing a structure of a superconducting wire material (multi-core tape wire) to be connected in an embodiment.

FIG. 1 is a view showing a structure of a Bi2223 multi-core tape wire material 10 to be connected. The multi-core tape wire material 10 has a superconducting layer 11 including a plurality of Bi2223 filaments, an Ag sheath (silver base metal) 12, and a protective material 13. As one example, the multi-core tape wire material 10 may have a width of 4.5 mm and a thickness of about 0.3 mm, and may include 100 or more Bi2223 filaments.

<Connection Body of Superconducting Wire Materials>

Figure 2:
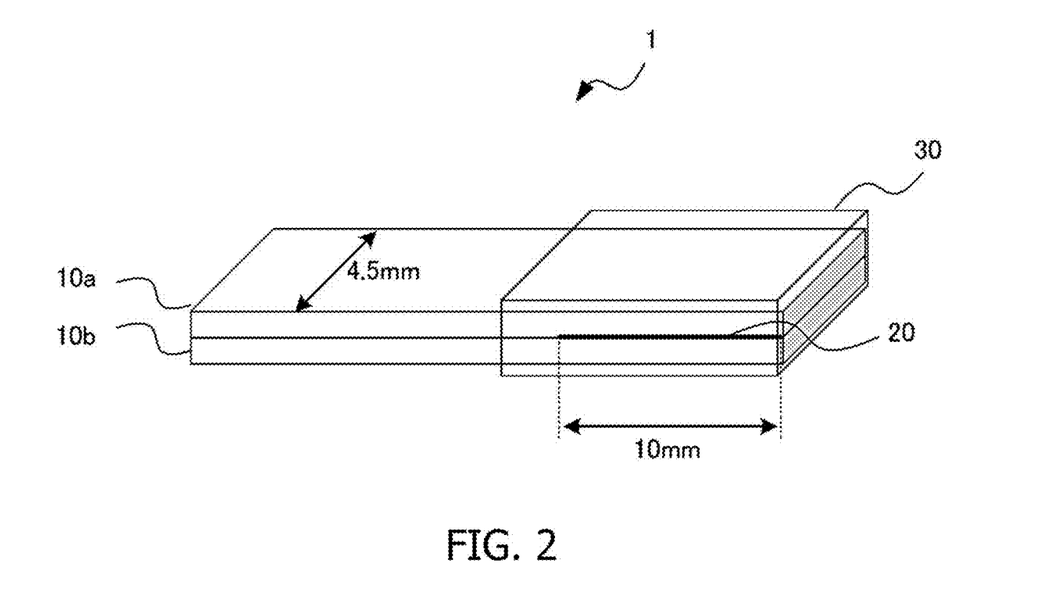
FIG. 2 is a view showing a structure of a connection body of superconducting wire materials in accordance with an embodiment.

FIG. 2 is a view showing an example of a structure of a connection body 1 of the Bi2223 multi-core tape wire materials 10. In multi-core tape wire materials 10a and 10b, the superconducting layers 11 are bonded together, for example, at about 10-mm ends. As described later, respective protective materials 13 and Ag sheaths 12 are removed at the junction part, and the superconducting layers 11 are bonded via a junction (junction layer) 20. Further, the end portion including the junction part may be covered with a reinforcing member 30 for reinforcing the connection. The reinforcing member 30 may include metal foil with a thickness of about 0.1 mm wound several times.

<Connecting Method>

Figure 3:
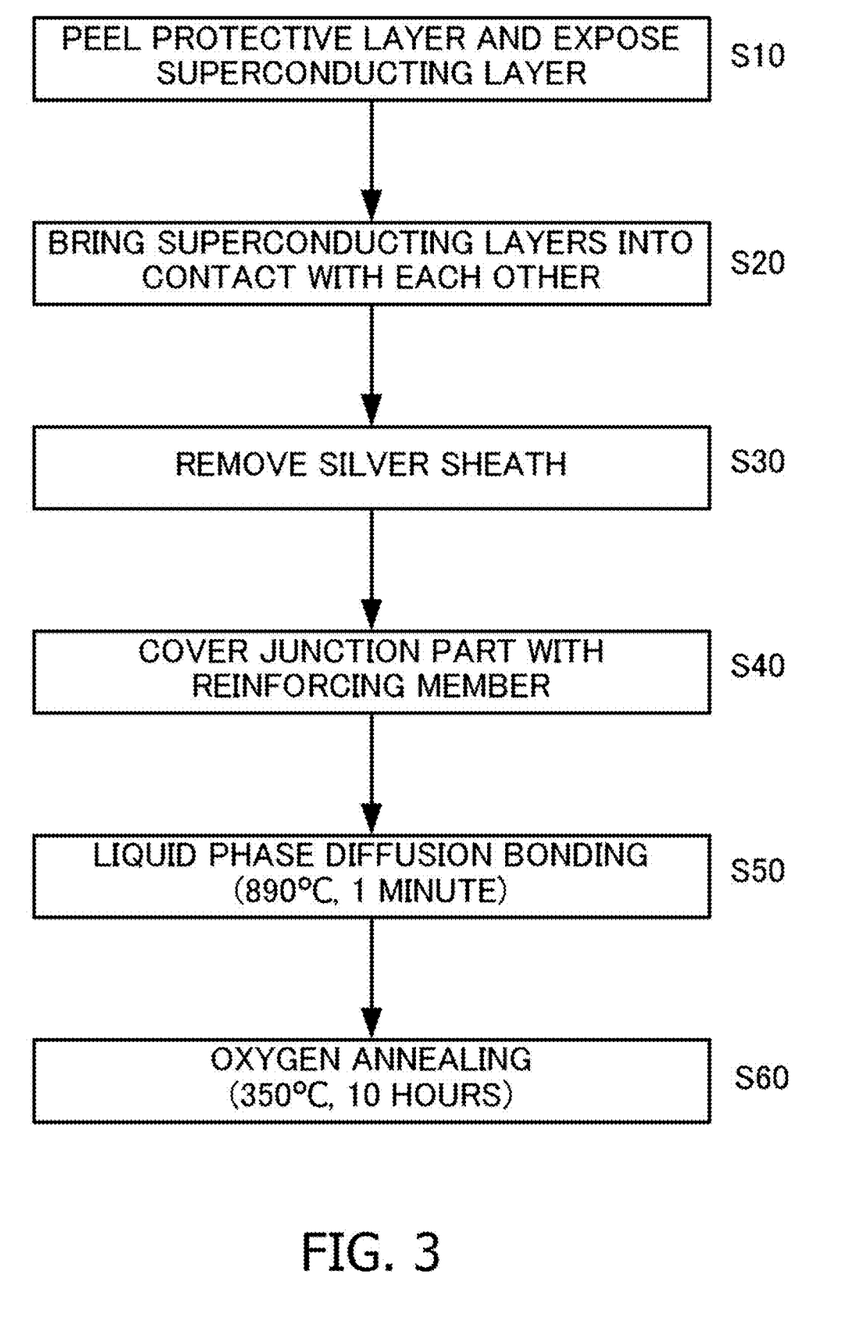
FIG. 3 is a flowchart showing a method for connecting the superconducting wire materials in accordance with an embodiment.

FIG. 3 is a flowchart showing a manufacturing method of the connection body 1, namely, a method for connecting superconducting wire materials.

In a step S10, the protective material 13 at each one surface of the junction part, namely, each of about 10-mm ends of the multi-core tape wire materials 10a and 10b is peeled, and then the Ag sheath is polished, thereby exposing the superconducting layers 11 (Bi2223 filaments).

In a step S20, the exposed portions of the superconducting layers 11 of the multi-core tape wire materials 10a and 10b are brought into contact with each other.

In a step S30, the Ag sheaths at the junction parts are removed. Specifically, Ag is molten or softened, and a pressure (10 MPa at 880° C.) is applied, thereby diffusing Ag. As a result, at respective end portions of the multi-core tape wire materials 10a and 10b, the Bi2223 filaments are brought into contact with one another or approach one another in the thickness direction of the wire materials. The Ag sheaths between the Bi2223 filaments at the end portions (junction part) are desirably fully removed to bring the filaments into direct contact with one another. However, it is not necessary to fully remove the Ag sheath, and it is also acceptable to have Ag sheath remained as long as the remained amount of Ag sheath becomes smaller compared with untreated portions.

In a step S40, the end portion including the junction part is covered with the reinforcing member 30 of a metal foil. The metal foil needs to be made of an oxygen-permeable material that is resistant to oxidation in the annealing step S60. Furthermore, the material needs to be resistant to oxidation and not molten in a bonding step S50. Therefore, as the reinforcing member 30, an alloy (e.g., Pd—Ag alloy) including a Pt-group element is desirably used. The reinforcing member 30 may be provided after the bonding step S50, and in this case, an Ag—Ni alloy undergoing less oxidation at around 400° C., or the like can also be used.

In the step S50, the multi-core tape wire materials 10a and 10b are heated to a temperature equal to or higher than the melting point of the Bi2223 phase (865° C. in the air), and a temperature equal to or lower than the melting point of the reinforcing member 30. Thus, at least a part of the Bi2223 phase is decomposed into a liquid, and the multi-core tape wire materials 10a and 10b are bonded at the maximum temperature for a short time such as within several minutes. The Bi2223 phase in only the vicinity of the contact surface of the two superconducting layers 11 may be molten, or the Bi2223 phase of the whole junction part may be molten. In the present embodiment, the superconducting layers 11 are heated at 890° C. for 1 minute, thereby bonding the superconducting layers 11 to each other. As described later, the present method has a feature in that a junction 20 including the Bi2212 phase and Ca—Cu—O is generated after the heat treatment.

In a step S60, an oxygen annealing treatment is performed, thereby introducing oxygen into the superconducting layers 11. The critical current of the junction interface depends upon the oxygen amount, and hence, the step S60 improves the superconducting performance.

<Sample Evaluation>

Figure 4:
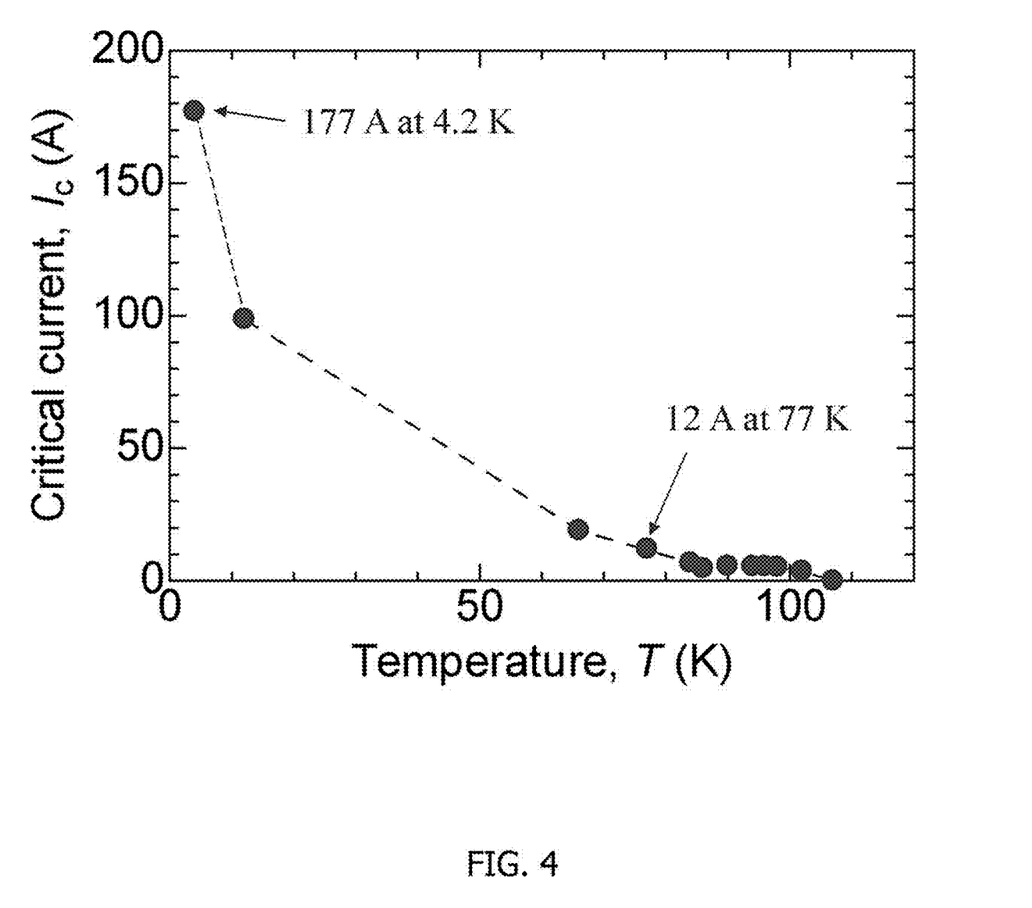
FIG. 4 is a view showing the temperature dependency of the critical current of the superconducting wire material in accordance with an embodiment.

The temperature dependency (Ic-T characteristic) of the critical current of the connection body 1 produced by the foregoing method was examined. FIG. 4 shows the results. The critical currents (1 μV standard) were 12 A at 77 K and 177 A at 4.2 K. This indicates that larger critical currents than those of the conventional connection body of the Bi2223 wire materials were obtained. Thus, a remarkable increase in critical current was observed particularly in the low temperature region.

Figure 5:
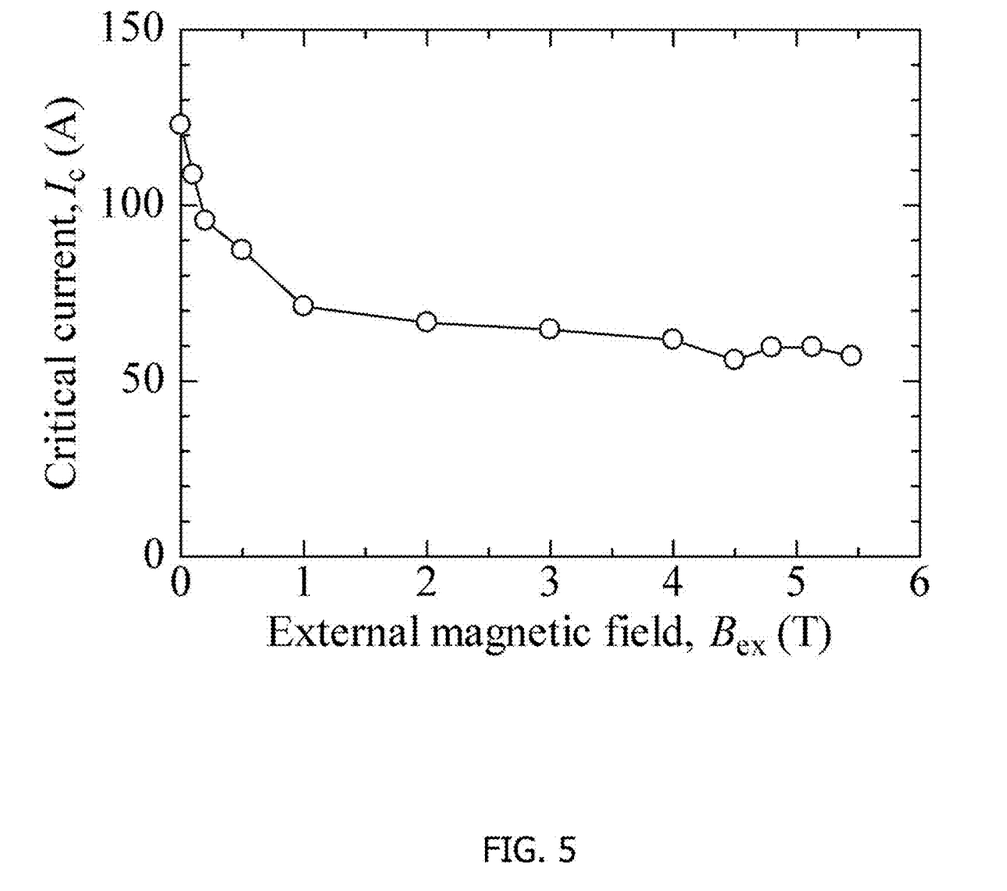
FIG. 5 is a view showing the results of the external magnetic field dependency of the critical current of the connection body of the superconducting wire materials in accordance with an embodiment.

Further, in order to examine the external magnetic field dependency of the critical current of the connection body 1, the critical current was measured while changing the external magnetic field of the connection body at 4.2 K. FIG. 5 shows the results. Even in the external magnetic field of 5.5 T, a critical current of 46% of the critical current at 0 T is held. This is a very useful characteristic in magnet application in which the junction is placed in a strong magnetic field.

Figure 6:
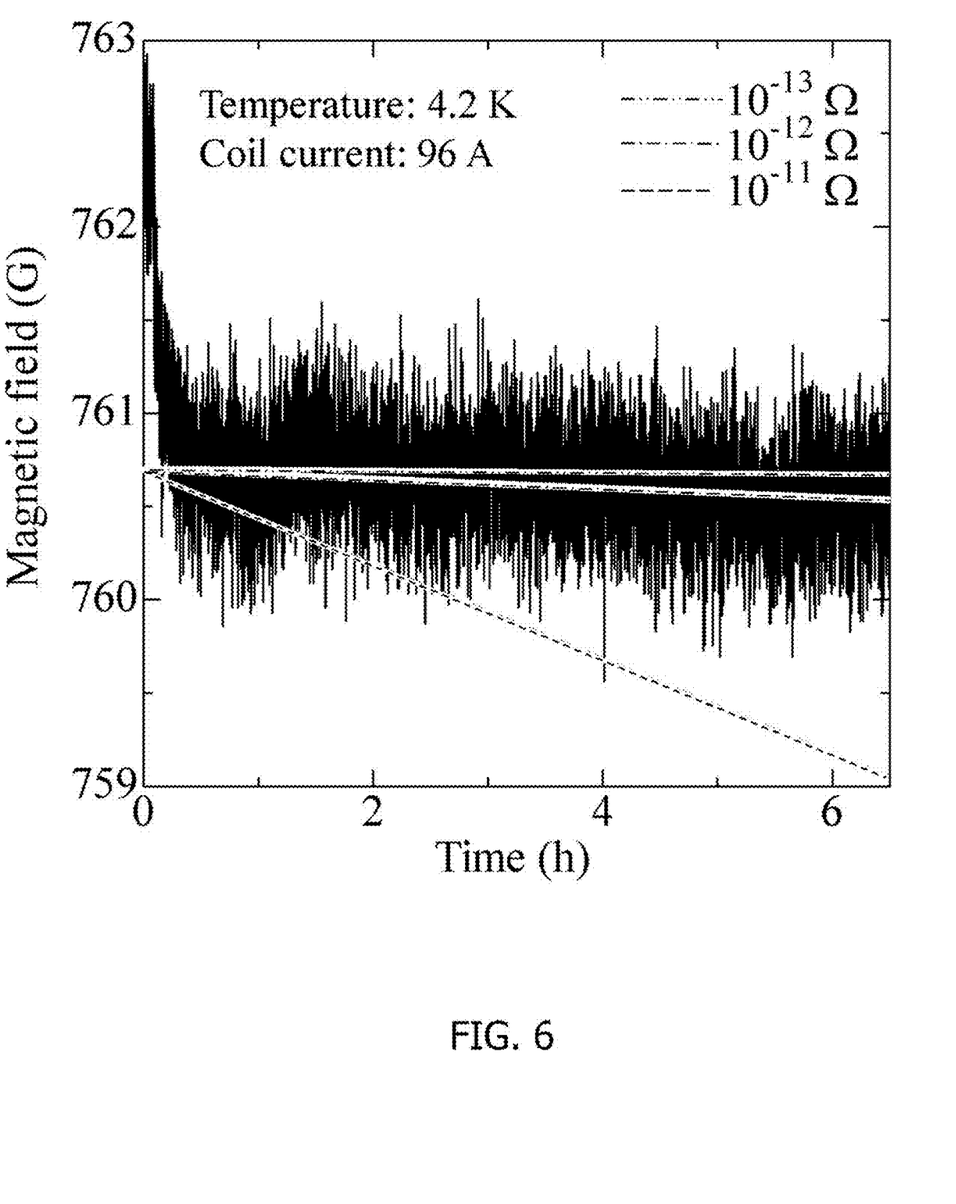
FIG. 6 is a view showing the results of persistent current measurement of a coil using the connection body of the superconducting wire materials in accordance with an embodiment.

Further, in order to examine the electric resistance of the connection body 1, a coil having only one junction portion was prepared, and the persistent current of the coil was measured at a liquid nitrogen temperature. FIG. 6 shows the results. The electric resistance of the coil was determined as about $10^{-12}\Omega$ on the basis of the temporal change of the coil central magnetic field. This indicates that the persistent current operation was implemented.

Figure 7:
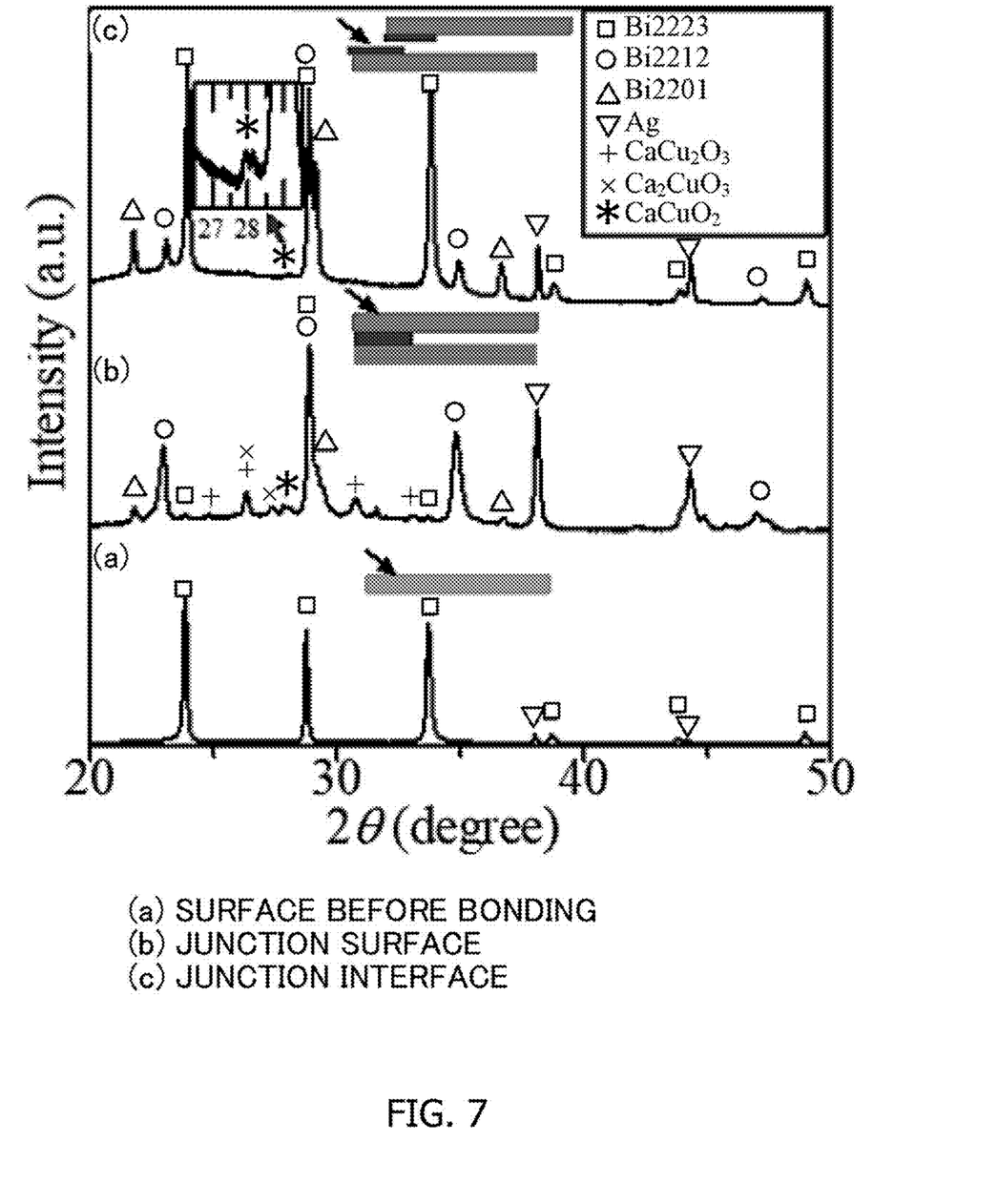
FIG. 7 is a view showing the results of X ray diffraction measurement (XRD) of the connection body of the superconducting wire materials in accordance with an embodiment.

Then, the composition of the junction 20 was examined by X ray diffraction measurement (XRD). The chart (a) of FIG. 7 shows the measurement results at the superconducting layer 11 surface before the bonding treatment; the chart (b) shows the measurement results at the surface opposite to the junction interface of the superconducting layer 11; and the chart (c) shows the measurement results at the junction interface of the superconducting layer 11. The chart (c) of FIG. 7 also includes an enlarged view of the vicinity of 2θ=28°. As indicated by the chart (a) of FIG. 7, the Bi2212 phase and Ca—Cu—O were not present before the bonding treatment. However, as indicated in the chart (c) of FIG. 7, the Bi2212 phase and Ca—Cu—O ($CaCuO_2$) were obtained at the interface after bonding. At the interface after bonding, not only $CaCuO_2$ but also $CaCu_2O_3$ and $Ca_2CuO_3$ were also present.

In this manner, that Bi2212 appeared at the junction interface, and hence it is understood that a heterojunction of Bi2223-Bi2212-Bi2223 was formed and superconducting connection was thereby established. However, it is known that, little superconductivity is shown at 77 K (the critical current being several amperes or less) only with this bonding. Since $CaCuO_2$ was obtained at the junction interface, it is considered that $Bi2223-CaCuO_2-Bi2223$ was formed and this contributed to superconducting connection at elevated temperatures. This result agrees with the report (D. Di Castro, 2015, Non-Patent Literature 3) that heterojunction of $CaCuO_2$, which does not show superconductivity in a simple substance form, could provide elevated temperature superconductivity.

Figure 8:
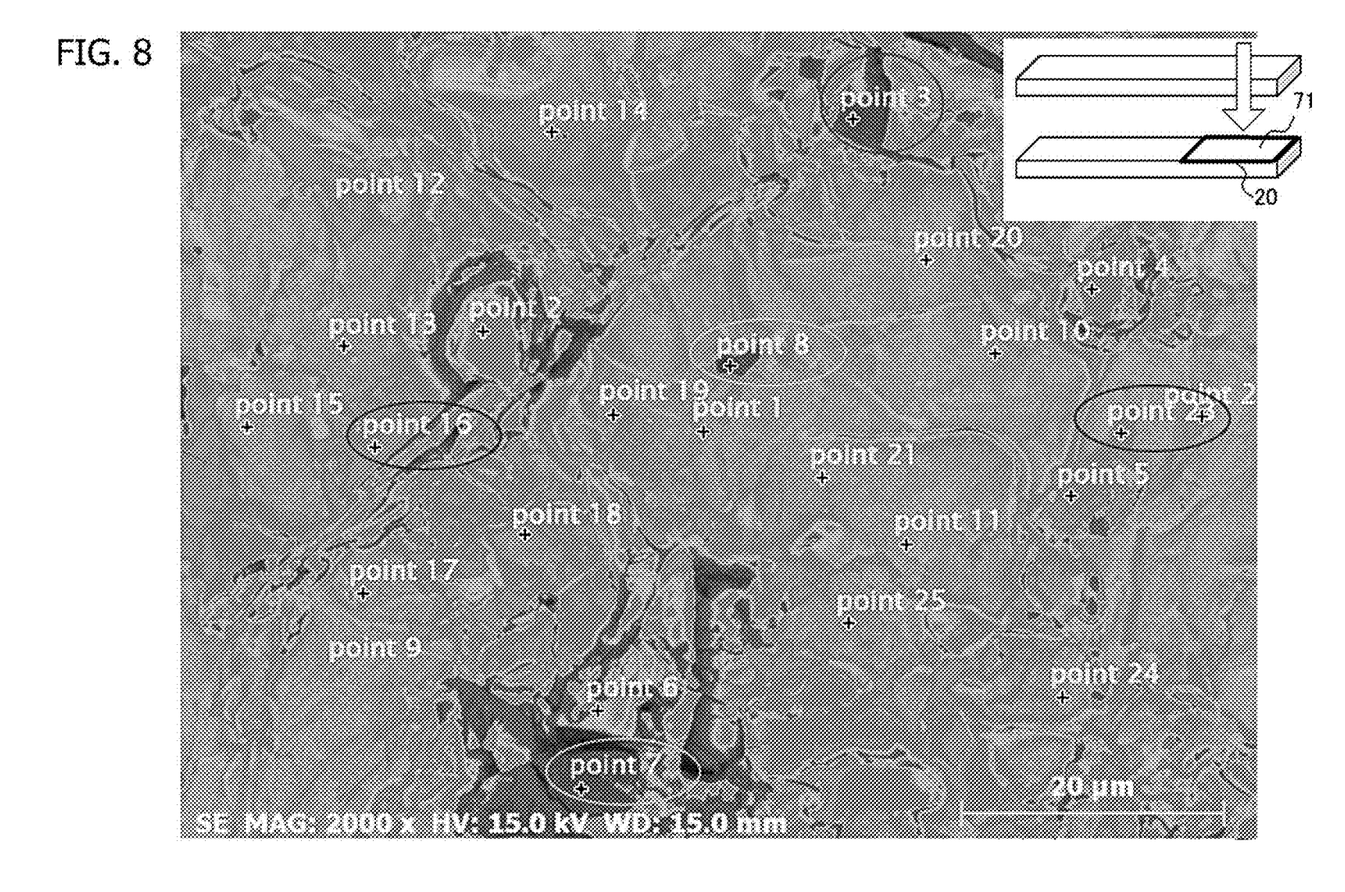
FIG. 8 is a view showing the analysis positions of EDS analysis of the connection body of the superconducting wire materials in accordance with an embodiment.
Figure 9:
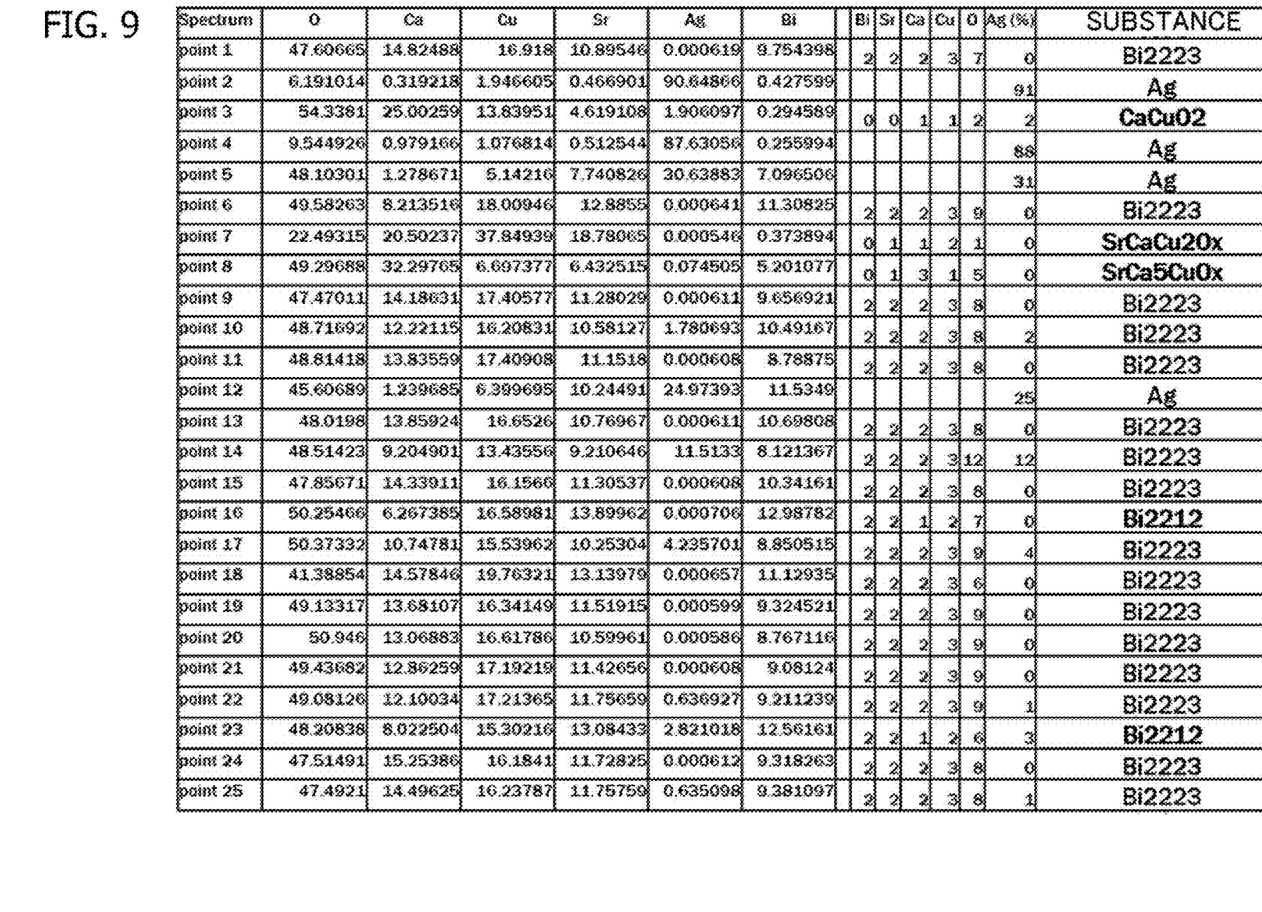
FIG. 9 is a view showing the analysis results of EDS analysis of the connection body of the superconducting wire materials in accordance with an embodiment.

Further, the composition of the junction 20 was examined by energy dispersive X-ray analysis (EDS). FIG. 8 is a view showing the analysis positions of EDS at a part of a junction interface 71 obtained by releasing the junction 20. As shown in FIG. 8, the compositions were analyzed at 25 positions from point 1 to point 25. FIG. 9 shows the detailed results of the EDS analysis. The composition ratios were analyzed only on the points with an Ag composition ratio of 20% or less. As shown in FIG. 9, Bi2212 was detected at points 16 and 23, and $CaCuO_2$ was detected at point 3. In this manner, the EDS analysis also revealed that Bi2212 and $CaCuO_2$ appeared at the junction interface. $SrCaCu_2O_x$ and $SrCa_5CuO_x$ (Sr—Ca—Cu—O) were also detected at points 7 and 8.

Figure 10:
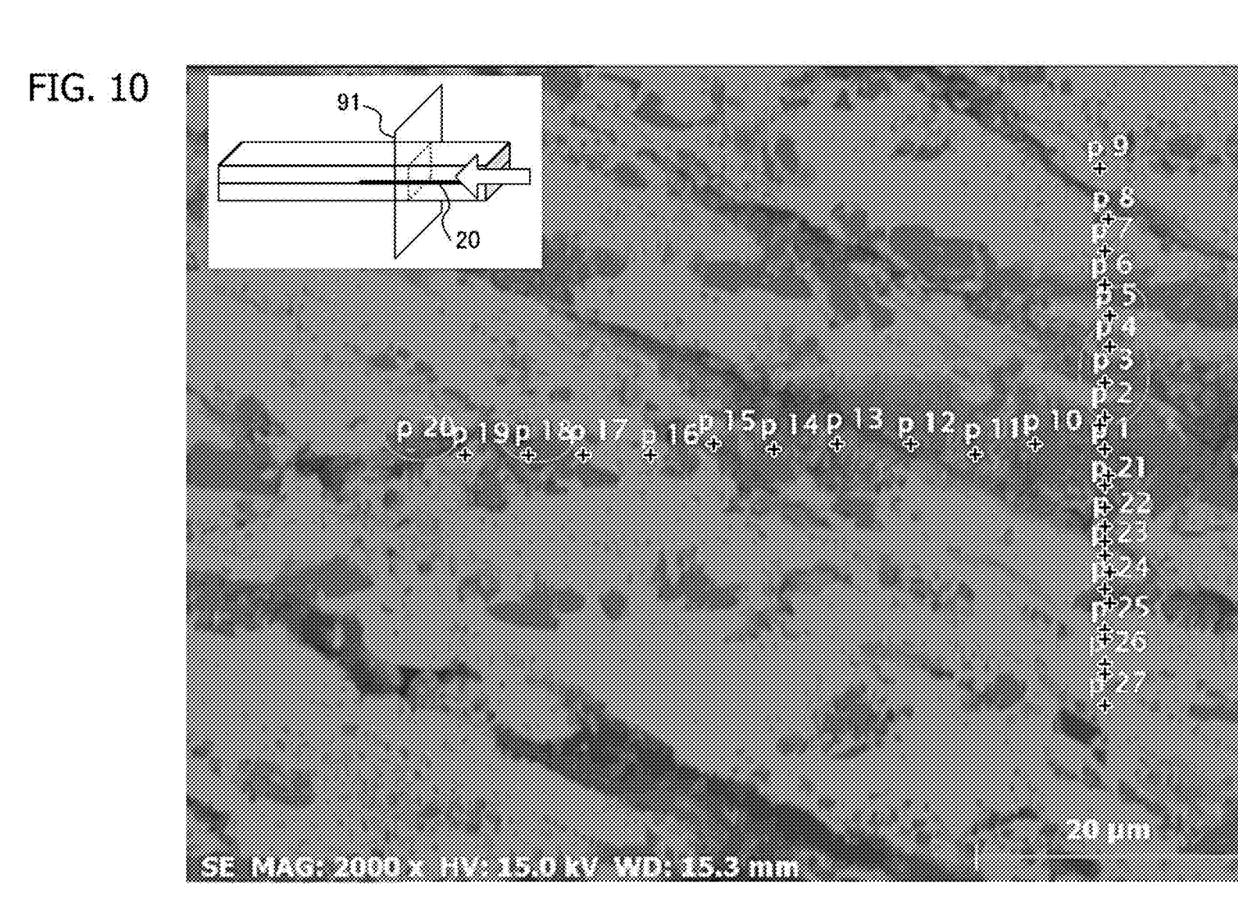
FIG. 10 is a view showing the analysis positions of EDS analysis of the connection body of the superconducting wire materials in accordance with an embodiment.
Figure 11:
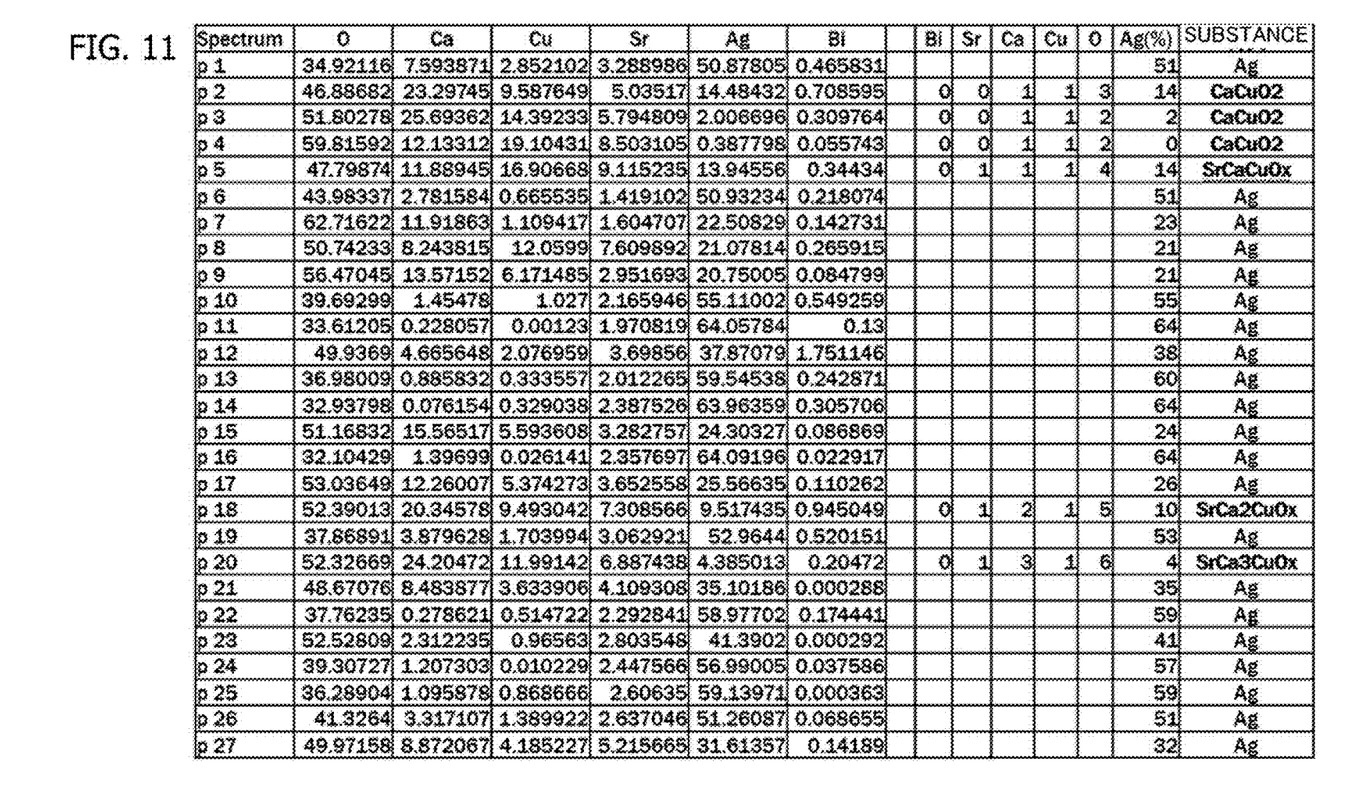
FIG. 11 is a view showing the analysis results of EDS analysis of the connection body of the superconducting wire materials in accordance with an embodiment.

Further, the cross section obtained by cutting the junction part of the connection body 1 at a plane 91 perpendicular to the wire material longitudinal direction was also similarly analyzed by EDS analysis. FIG. 10 is a view showing the analysis positions of EDS at a part of the junction cross section. As shown in FIG. 10, the compositions were analyzed at a plurality of positions (20 positions) in the thickness direction and in the width direction about a point p1 as the center. FIG. 11 shows the detailed results of the EDS analysis. As shown in FIG. 11, $CaCuO_2$ was detected at points p2, p3, and p4; $SrCa_2CuO_x$ was detected at point p18; and $SrCr_3CuO_x$ was detected at point p20.

Figure 12A:
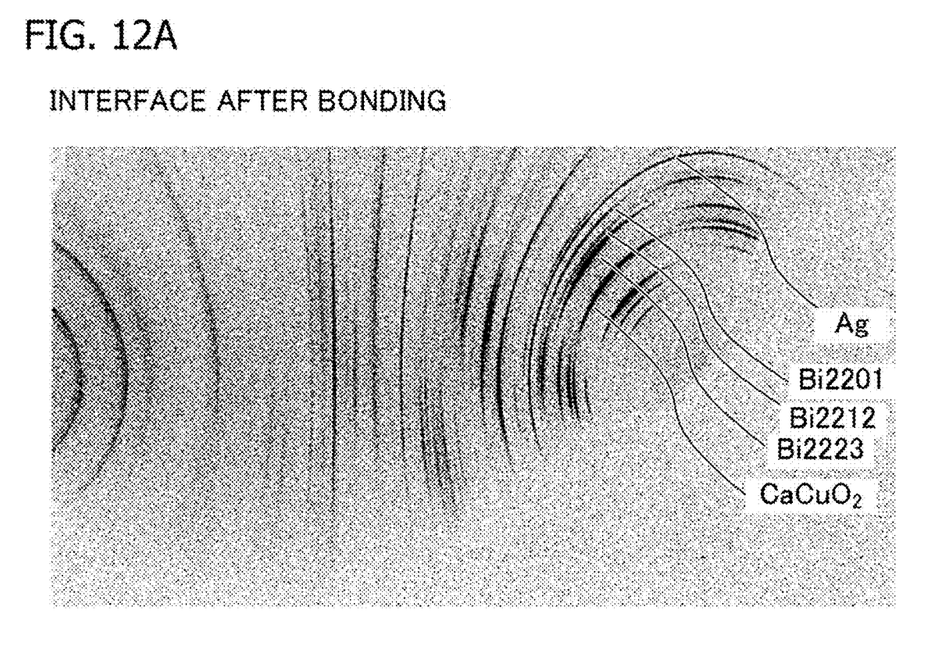
FIGS. 12A and 12B are each a view showing the measurement results of curved IPX ray analysis measurement of the connection body of the superconducting wire materials in accordance with an embodiment.
Figure 12B:
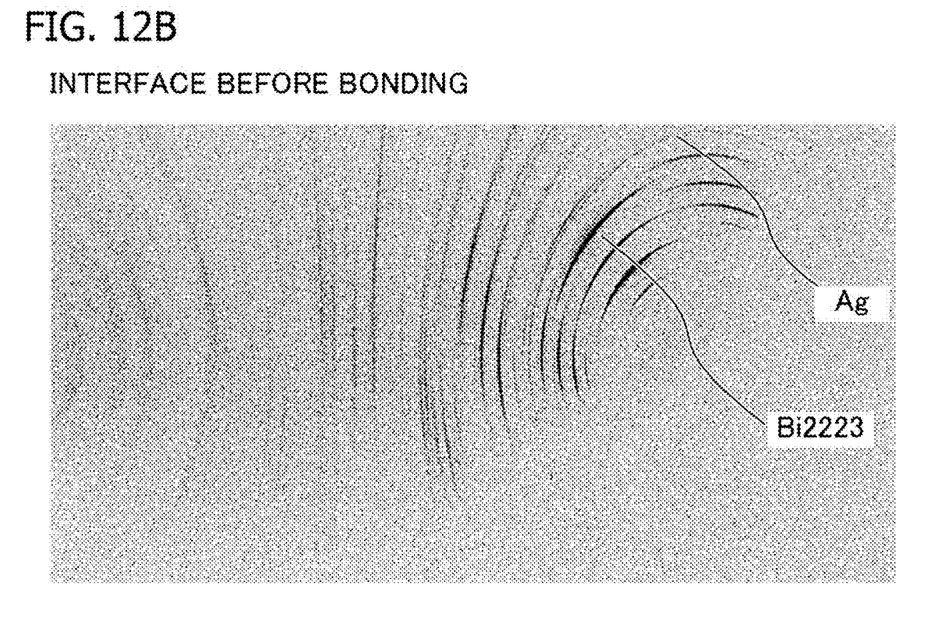

Further, it is necessary for the 00L plane to be oriented in the c-axis direction for the purpose that a Bi2212 or $CaCuO_2$ (M-Cu—O) layer shows a high critical current as high temperature superconductivity. For determining the orientation, the junction interface was analyzed by curved IPX ray analysis. FIG. 12A shows the measurement results of the interface after bonding, and FIG. 12B shows the measurement results of the interface after bonding. It is indicated that, for the 00L planes of Bi2201, Bi2212, and $CaCuO_2$ were oriented in the c-axis direction at the interface after bonding.

<Advantageous Effects of Present Embodiment>

The present embodiment can provide a critical current that is sufficient for practically connect the Bi2223 wire materials. Further, with the coil obtained by connecting the Bi2223 wire materials, a persistent current operation can be attained. Further, with the manufacturing method in accordance with the present embodiment, a long-time crystal growth process is not used, and hence bonding can be performed in a short time. The mechanical strength of bonding is also sufficiently high, and further, use of the reinforcing member 30 further increases the strength. Herein, the strength of bonding itself is high, which provides the following advantage; the reinforcing member 30 may be small, which can prevent breakage of bonding due to the self-gravity of the reinforcing member 30, and facilitates handling thereof.

Further, as the pretreatment of bonding, at the junction part, the Ag sheath present between the Bi2212 filaments is removed and the filaments are then bonded in the wire material thickness direction. As a result, all the filaments of the two wire materials are surely bonded, and thus, a large critical current can be obtained. With a method including obliquely cutting each of two wire materials and bonding them, connection on a filament unit basis has been tried, but connection is achieved only stochastically. For this reason, a large critical current cannot be obtained, or variations are caused in performances. In the present embodiment, such problems can be resolved.

Other Embodiments

In the first Embodiment, superconducting connection is achieved by heterojunction of Bi2223-Bi2212-Bi2223 or Bi2223-$CaCuO_2$-Bi2223. However, the superconducting wire material to be connected is not limited to a Bi2223 wire material so long as it is an oxide high-temperature superconducting wire material.

For example, REBCO wire materials may be connected in the same manner as described above. In the case of connection between the REBCO wire materials, the Ba—Cu—O layer contributes to the superconducting connection. Further, Bi2212 wire materials may be connected by the same method as that described above. In the case of connection between Bi2212 wire materials, the Ca—Cu—O layer contributes to superconducting connection. Further, different kinds of oxide high-temperature superconducting wire materials may be connected in the same manner as described above. The principle of such connection is basically the same as in the case of Bi2223. This is because Bi2223, Bi2212, and REBCO, all of which are high-temperature superconducting substances, all have a $CuO_2$ layer as a superconducting layers in the crystal structures, and accordingly, the superconducting layers are also linked in bonding via a $CuO_2$ layer that is included in Ba—Cu—O or Ca—Cu—O. Thus, superconducting bonding can be achieved in all cases.

In the first Embodiment, the superconducting layers are brought into direct contact with each other, and are bonded by liquid phase diffusion bonding. However, liquid phase diffusion bonding may be performed by interposing a metal thin film (insert metal) between the superconducting layers in order to form M-Cu—O in the junction layer. In this case, it is not necessary that the metal M is included in an oxide high-temperature superconducting wire material, and may be any one of metals that achieves high-temperature superconducting at the interface. In other words, the insert metal includes a metal M, and may be a metal not causing changes in performances such as the critical temperature and the critical current of the superconducting layer. A substance with a lower ionization tendency than that of Cu such as Pd or Au does not undergo a substitution reaction with Cu of the superconducting layer at elevated temperatures, and hence can be used. Further, Pb is also usable because Pb does not largely reduce the performances of the superconducting layer. Thus, when the insert metal is used, a junction including $M_1$-Cu—O and $M_2$-Cu—O is formed between two superconducting layers. Herein, $M_1$ is a single metal element or a plurality of metal elements included in the first superconducting layer or the second superconducting layer, and $M_2$ is a single metal element or a plurality of metal elements included in the insert metal.

Although embodiments of the present invention are thus far described in an exemplary manner, it should be understood that the scope of the present invention is not limited to those embodiments but is defined by the words of the claims. The detailed description is to be construed as exemplary only and does not describe every possible embodiment because describing every possible embodiment would be impractical, if not impossible. Numerous embodiments could be implemented, using either current technology or technology developed after the filing date of this patent, which would still fall within the scope of the claims.

What is claimed is:

1. A connection body of high-temperature superconducting wire materials, comprising:
a first oxide high-temperature superconducting wire material and
a second oxide high-temperature superconducting wire material, wherein
a first superconducting layer of the first oxide high-temperature superconducting wire material and a second superconducting layer of the second oxide high-temperature superconducting wire material are superconductively bonded together via a junction including $CaCuO_2$,
the first superconducting layer and the second superconducting layer are each independently any one of Bi2223 ($Bi_2Sr_2Ca_2Cu_3O_x$) and Bi2212 ($Bi_2Sr_2Ca_1Cu_2O_x$), and
the 00L planes of the first superconductive layer, the second conductive layer and the $CaCuO_2$ are oriented in a c-axis direction at an interface of the bonding.

2. A connection body of high-temperature superconducting wire materials, comprising:
a first oxide high-temperature superconducting wire material and
a second oxide high-temperature superconducting wire material, wherein
a first superconducting layer of the first oxide high-temperature superconducting wire material and a second superconducting layer of the second oxide high-temperature superconducting wire material are superconductively bonded together via a junction including $BaCuO_2$,
the first superconducting layer and the second superconducting layer are REBCO ($(RE)Ba_2Cu_3O_x$, wherein RE is one or a plurality of rare earth elements), and
the 00L planes of the first superconductive layer, the second superconductive layer and the $BaCuO_2$ are oriented in a c-axis direction at an interface of the bonding.

3. The connection body of high-temperature superconducting wire materials according to claim 1, wherein the first superconducting layer and the second superconducting layer are both Bi2223.

4. The connection body of high-temperature superconducting wire materials according to claim 3,
wherein the first superconducting layer and the second superconducting layer each include a plurality of Bi2223 filaments, and an Ag sheath, and
wherein, at the junction part, the Ag sheath is less in amount than at other parts.

5. The connection body of high-temperature superconducting wire materials according to claim 1, wherein the junction part is covered with a reinforcing member including an Ag-, Ni-, or Pt-group metal or an alloy including two or more of these metals.

* * * * *